US011289138B2

(12) United States Patent
Yoo et al.

(10) Patent No.: US 11,289,138 B2
(45) Date of Patent: *Mar. 29, 2022

(54) MEMORY DEVICE INCLUDING PLURALITY OF LATCHES AND SYSTEM ON CHIP INCLUDING THE SAME

(71) Applicant: SAMSUNG ELECTRONICS CO., LTD., Suwon-si (KR)

(72) Inventors: Young-shin Yoo, Seoul (KR); Min-su Kim, Hwaseong-si (KR); Hyun-chul Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/104,592

(22) Filed: Nov. 25, 2020

(65) Prior Publication Data

US 2021/0158847 A1    May 27, 2021

Related U.S. Application Data

(63) Continuation of application No. 16/375,201, filed on Apr. 4, 2019, now Pat. No. 10,867,645.

(30) Foreign Application Priority Data

Apr. 5, 2018 (KR) .................. 10-2018-0039997
Oct. 12, 2018 (KR) .................. 10-2018-0122034

(51) Int. Cl.
*G11C 7/10* (2006.01)
*G11C 7/22* (2006.01)
(Continued)

(52) U.S. Cl.
CPC .......... *G11C 7/1087* (2013.01); *G06F 3/0604* (2013.01); *G06F 3/0659* (2013.01);
(Continued)

(58) Field of Classification Search
CPC ......... G11C 7/222; G11C 16/26; G11C 7/106; G11C 7/1087; G11C 7/22; G11C 16/08;
(Continued)

(56) References Cited

U.S. PATENT DOCUMENTS 4,879,680 A    11/1989 Luckett et al.
6,208,705 B1    3/2001 Lomazzi et al.
(Continued)

OTHER PUBLICATIONS

Henrik Sundkøien Sørvik "Register file optimisation" Norwegian University of Science and Technology, Jun. 2017 (166 pages).

*Primary Examiner* — Hien N Nguyen
(74) *Attorney, Agent, or Firm* — Sughrue Mion, PLLC

(57) ABSTRACT

A memory device includes a plurality of latches arranged in a plurality of columns including a first column and a second column and in a plurality of rows, a first flip flop configured to output first data, to first latches arranged in the first column, among the plurality of latches, based on a clock, and a second flip flop configured to output second data, to second latches arranged in the second column, among the plurality of latches, based on the clock. The first flip flop is further configured to, in a lock time section in which the first latches and the second latches maintain an output regardless of an input, block output of the first data to the first latches, and the second flip flop is further configured to, in the lock time section, block output of the second data to the second latches.

20 Claims, 16 Drawing Sheets

(51) Int. Cl.
 *G06F 3/06* (2006.01)
 *G11C 8/10* (2006.01)

(52) U.S. Cl.
 CPC ............ *G06F 3/0673* (2013.01); *G11C 7/106* (2013.01); *G11C 7/1096* (2013.01); *G11C 7/22* (2013.01); *G11C 8/10* (2013.01)

(58) Field of Classification Search
 CPC ... G11C 16/32; G11C 11/4076; G11C 11/418; G11C 29/023; G11C 7/1063; G11C 7/109
 See application file for complete search history.

(56) References Cited

U.S. PATENT DOCUMENTS

| | | |
|---|---|---|
| 7,065,665 B2 | 6/2006 | Jacobson et al. |
| 7,257,763 B1 | 8/2007 | Srinivasan et al. |
| 7,313,768 B2 | 12/2007 | Mochizuki |
| 8,018,791 B2 | 9/2011 | Kwak |
| 8,848,429 B2 | 9/2014 | Vilangudipitchai et al. |
| 8,988,966 B2 | 3/2015 | Kwak |
| 9,250,899 B2 | 2/2016 | Gschwind |
| 10,867,645 B2 * | 12/2020 | Yoo .................... G11C 8/10 |
| 2011/0241744 A1 | 10/2011 | Moudgill et al. |
| 2012/0008450 A1 | 1/2012 | Turner et al. |
| 2018/0342282 A1 | 11/2018 | Morgan |
| 2019/0080743 A1 | 3/2019 | Lee et al. |

\* cited by examiner

MEMORY DEVICE INCLUDING PLURALITY OF LATCHES AND SYSTEM ON CHIP INCLUDING THE SAME

CROSS-REFERENCE TO THE RELATED APPLICATIONS

This is a continuation application of U.S. patent application Ser. No. 16/375,201, filed Apr. 4, 2019, in the U.S. Patent and Trademark Office, which claims priority from Korean Patent Application Nos. 10-2018-0039997 and 10-2018-0122034, filed on Apr. 5, 2018, and Oct. 12, 2018, respectively, in the Korean Intellectual Property Office, the disclosures of which are incorporated herein by reference in their entireties.

BACKGROUND

Apparatuses consistent with embodiments relate to a memory device and a system on chip including the same, and more particularly, to a memory device for storing data through a shared latch and a plurality of latches connected to the shared latch, and a system on chip including the same.

As a mobile product such as a tablet PC or a mobile phone develops, a high performance of a computing system including a component device such as a memory device and an SoC may be required. The SoC includes a memory device for storing data therein. The memory device may include a plurality of latches arranged in columns and rows. The memory device may write data to the plurality of latches and read the written data. As the high performance and low power of the SoC may be required, high performance and low power may be required for the memory device included in the SoC.

SUMMARY

According to embodiments, a memory device includes a plurality of latches arranged in a plurality of columns including a first column and a second column and in a plurality of rows, each of the plurality of latches being configured to store at least one bit of data, a first flip flop configured to output first data, to first latches arranged in the first column, among the plurality of latches, based on a clock, and a second flip flop configured to output second data, to second latches arranged in the second column, among the plurality of latches, based on the clock. The first flip flop is further configured to, in a lock time section in which the first latches and the second latches maintain an output regardless of an input, block output of the first data to the first latches, and the second flip flop is further configured to, in the lock time section, block output of the second data to the second latches.

According to embodiments, a system on chip includes a control processing unit (CPU) configured to write first data to a plurality of latches through access to the plurality of latches, and a memory device configured to store the first data in correspondence to the access of the CPU. The memory device includes the plurality of latches arranged in a plurality of columns including a first column and in a plurality of rows, each of the plurality of latches being configured to store at least one bit of data, and a first blocking circuit configured to output at least some bits of the first data, to first latches arranged in the first column, among the plurality of latches, based on a clock, and block a signal that is applied to the first latches arranged in the first column, in a lock time section in which the first latches arranged in the first column do not output data.

According to embodiments, a memory device includes a plurality of latches arranged in a plurality of columns and a plurality of rows, each of the plurality of latches being configured to store at least one bit of data, and a bitwise enabler configured to mask one or more latches arranged in at least some of the plurality of columns, based on a plurality of bit enable signals. The one or more latches are configured to, when masked by the bitwise enabler, receive write data, without storing the write data.

DETAILED DESCRIPTION OF THE EMBODIMENTS

The inventive concept provides a memory device capable of minimizing power consumption by including a shared latch, and a system on chip including the same.

The inventive concept also provides a memory device capable of selectively writing bits of data when writing the data to a plurality of latches, by including a masking circuit for masking the plurality of latches for each column, and a system on chip including the same.

Figure 1:
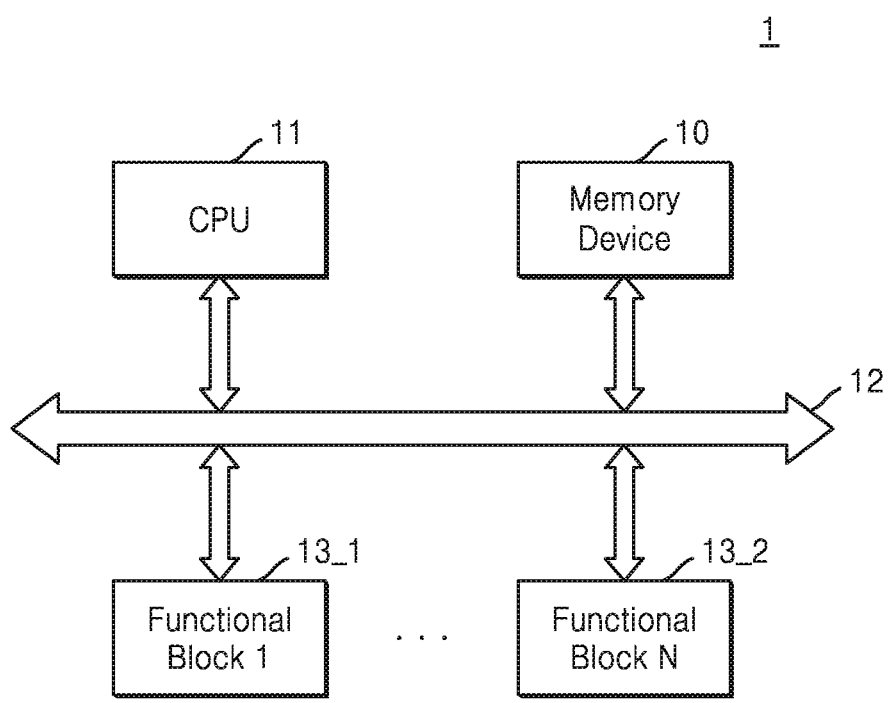
FIG. 1 is a block diagram illustrating a computing system according to embodiments of the inventive concept.

FIG. 1 is a block diagram illustrating a computing system according to embodiments of the inventive concept.

Referring to FIG. 1, a system on chip 1 may include a memory device 10, a CPU 11, a bus 12, and a plurality of functional blocks 13_1 and 13_2. The system on chip 1 may be applied to a smart phone, a tablet personal computer (PC), a digital camera, a mobile device, a set-top box, a smart card system, a server system, and various electronic devices. The system on chip 1 may include a plurality of components on one chip. For example, the system on chip 1 may include a device controller for controlling component devices such as the memory device 10, the plurality of functional blocks 13_1 and 13_2, and the like. According to embodiments, the system on chip 1 may be implemented as an application processor The CPU 11 may control operations of the memory device 10 and the plurality of functional blocks 13_1 and 13_2 connected via the bus 12. For example, the CPU 11 may write or read data by accessing the memory device 10.

The memory device 10 may store instructions, data or program codes used for an operation of the system on chip 1. In an embodiment, the memory device 10 may include a plurality of latches and may write data to the plurality of latches. The memory device 10 may be a latch-based memory.

The plurality of functional blocks 13_1 and 13_2 may perform various functions supported by the system on chip 1. For example, the plurality of functional blocks 13_1 and 13_2 may include a modem, a memory controller, an input/output device, a display device, a digital signal processor (DSP), a universal serial bus (USB) controller, a peripheral component interconnect (PCI) interface, etc.

The memory device 10 according to an embodiment of the inventive concept may include a blocking circuit shared by the plurality of latches. The blocking circuit may block signal transmission to the plurality of latches during a period in which the plurality of latches are locked, and consequently power consumed by the memory device 10 may be reduced.

Figure 2:
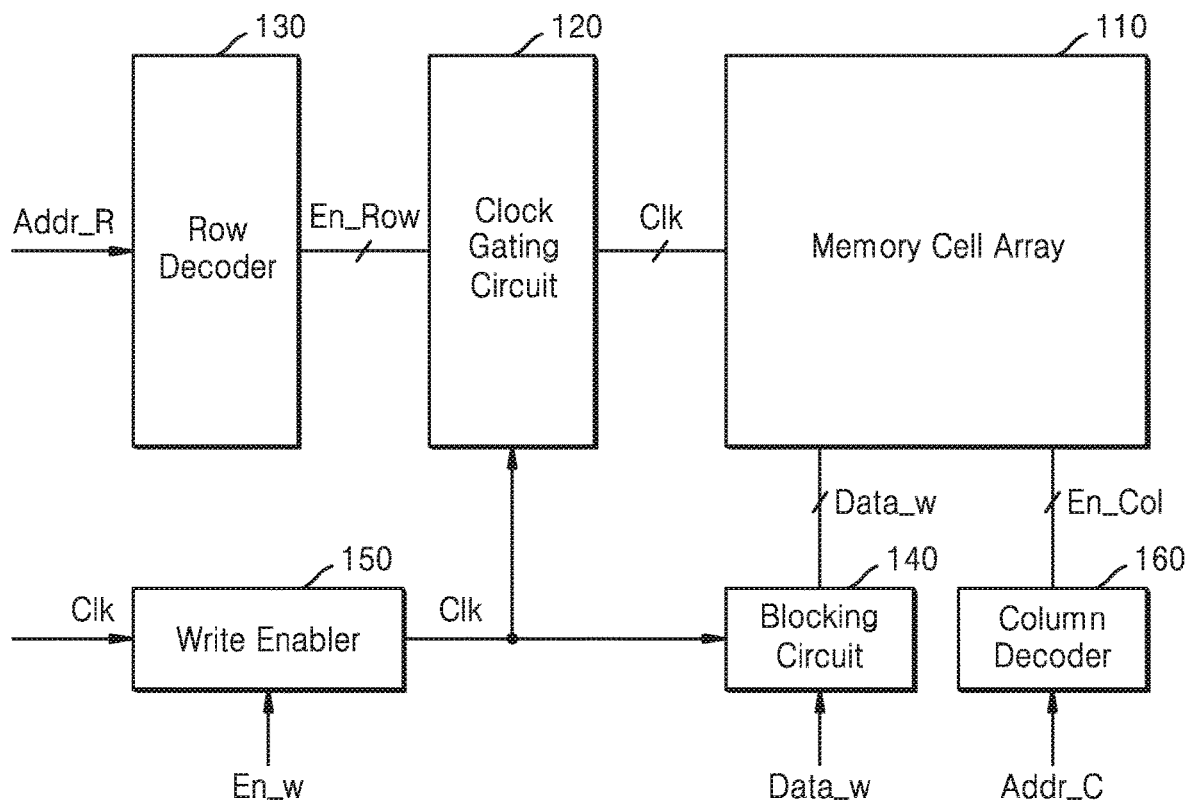
FIG. 2 is a block diagram illustrating a memory device according to embodiments of the inventive concept.

FIG. 2 is a block diagram illustrating the memory device 10 according to embodiments of the inventive concept.

Referring to FIG. 2, the memory device 10 may include a memory cell array 110, a clock gating circuit 120, a row decoder 130, a blocking circuit 140, a write enabler 150, and a column decoder 160.

The memory cell array 110 may include a plurality of memory cells arranged in rows and columns. In an embodiment, the plurality of memory cells may be a plurality of latches. The memory cell array 110 may store write data Data_w based on a clock Clk. The plurality of latches may be connected to the row decoder 130 and the clock gating circuit 120 in a row direction and may be connected to the blocking circuit 140 and the column decoder 160 in a column direction.

The row decoder 130 may receive a row address Addr_R and may output a row enable signal En_Row generated by decoding the row address Addr_R to the clock gating circuit 120. The clock gating circuit 120 may output the clock Clk to a row of the corresponding memory cell array 110 based on the row enable signal En_Row.

The write enabler 150 may output the clock Clk to the clock gating circuit 120 and the blocking circuit 140 based on a write enable signal En_w. The blocking circuit 140 may receive the write data Data_w and may output the write data Data_w to the memory cell array 110 based on the clock Clk. The blocking circuit 140 may be connected to the plurality of latches arranged in the column direction and may block an output of the write data Data_w in a lock time section in which the plurality of latches arranged in the column direction are locked.

The column decoder 160 may receive a column address Addr_C and output a column enable signal En_Col generated by decoding the received column address Addr_C to the memory cell array 110. The memory cell array 110 may output data of a corresponding column based on the column enable signal En_Col.

The memory device 10 according to an embodiment of the inventive concept may include the blocking circuit 140 that blocks a data output with respect to the memory cell array 110 in a section in which the memory cell array 110 may not store data, thereby preventing unnecessary power consumption and improving the performance.

Figure 3:
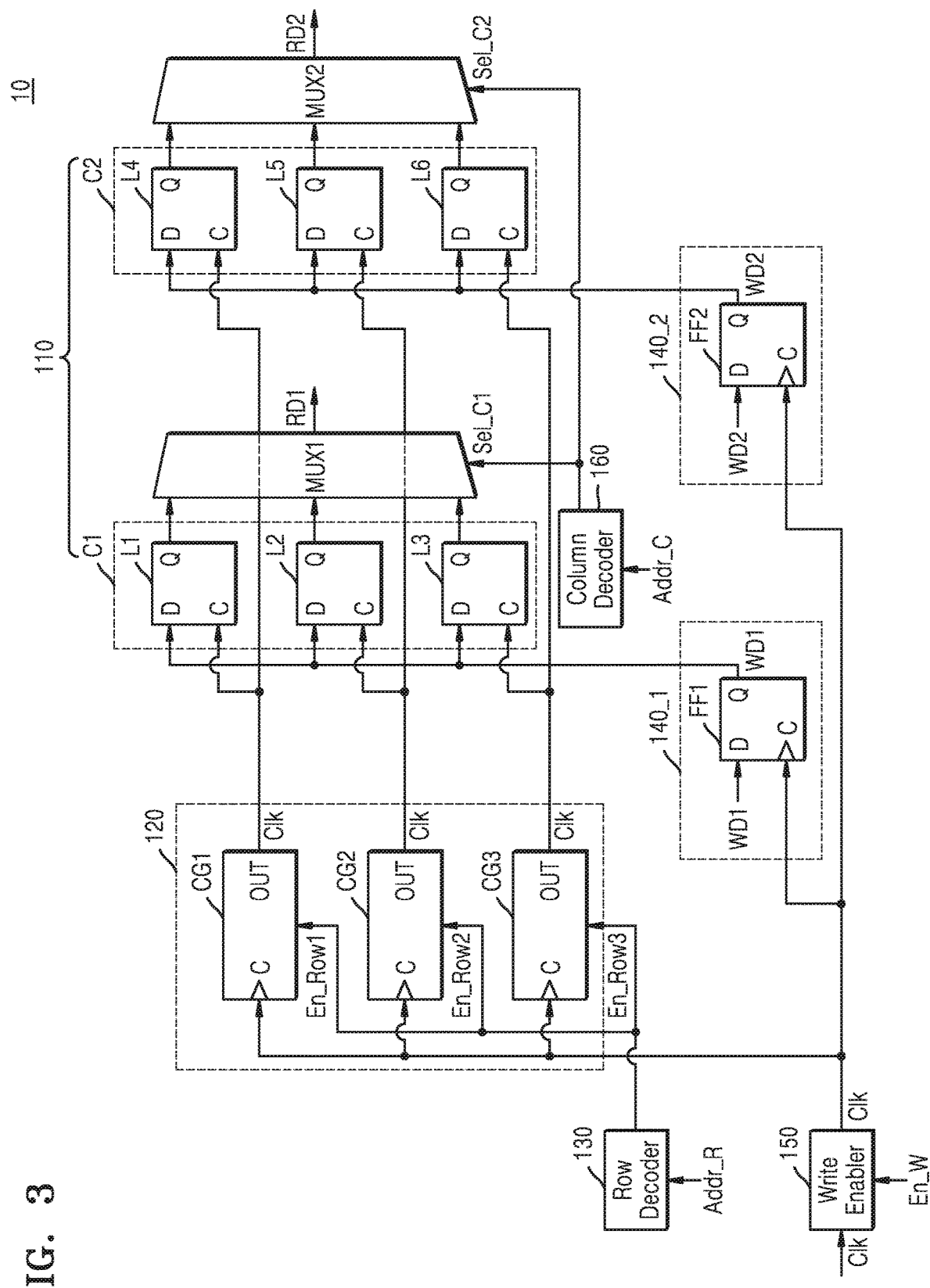
FIG. 3 is a circuit diagram illustrating a memory device according to embodiments of the inventive concept.

FIG. 3 is a circuit diagram illustrating the memory device 10 according to embodiments of the inventive concept. Redundant descriptions between FIGS. 2 and 3 will be omitted.

Referring to FIG. 3, the memory device 10 may include the memory cell array 110, the clock gating circuit 120, the row decoder 130, a first blocking circuit 140_1, a second blocking circuit 140_2, the write enabler 150, and the column decoder 160. The row decoder 130, the write enabler 150, and the column decoder 160 are described above with reference to FIG. 2, and thus descriptions thereof will be omitted.

The memory cell array 110 may include a first latch L1 to a sixth latch L6. The first latch L1 to the third latch L3 (first latches) may be arranged in a first column C1. The fourth latch L4 to the sixth latch L6 (second latches) may be arranged in a second column C2. An embodiment in which the six latches L1 to L6 are included in the memory cell array 110 is described below, but this is only an embodiment. The memory cell array 110 may include six or more or less latches.

The clock gating circuit 120 may include a first clock gate CG1 to a third clock gate CG3. The first clock gate CG1 may be connected to the first latch L1 and the fourth latch L4 (third latches) arranged in a first row of the memory cell array 110. The second clock gate CG2 may be connected to the second latch L2 and the fifth latch L5 (fourth latches) arranged in a second row of the memory cell array 110. The third clock gate CG3 may be connected to the third latch L3 and the sixth latch L6 arranged in a third row of the memory cell array 110.

The first clock gate CG1 may output the clock Clk received from the write enabler 150 to the first latch L1 and the fourth latch L4 based on a first row enable signal En_Row1 received from the row decoder 130. The second clock gate CG2 may output the clock Clk received from the write enabler 150 to the second latch L2 and the fifth latch L5 based on a second row enable signal En_Row2 received from the row decoder 130. The third clock gate CG3 may output the clock Clk received from the write enabler 150 to the third latch L3 and the sixth latch L6 based on a third row enable signal En_Row3 received from the row decoder 130.

The first blocking circuit 140_1 may include a first flip flop FF1. The second blocking circuit 140_2 may include a second flip flop FF2. The first flip flop FF1 may receive a first write data bit WD1 and output the first write data bit WD1 to the first latch L1 to the third latch L3 in correspondence with an edge of the clock Clk received from the write enabler 150. The first latch L1 to the third latch L3 may store the first write data bit WD1 based on the clock Clk of the clock gating circuit 120. The second flip flop FF2 may receive a second write data bit WD2 and output the second write data bit WD2 to the fourth latch L4 to the sixth latch L6 in correspondence with the edge of the clock Clk received from the write enabler 150. The fourth latch L4 to the sixth latch L6 may store the second write data bit WD2 based on the clock Clk of the clock gating circuit 120.

According to an embodiment of the inventive concept, the blocking circuits 140_1 and 140_2 may respectively include first and second flip flops FF1 and FF2 that may not output data with respect to the first latch L1 to the sixth latch L6 in a lock time section in which the first latch L1 to the sixth latch L6 are locked and uniformly maintain outputs, and thus power consumption according to output of the first and second write data bits WD1 and WD2 may be prevented.

The column decoder 160 may output a first column select signal Sel_C1 to a first multiplexer MUX1 based on a column address Addr_C and accordingly the first multiplexer MUX1 may output data stored in any one of the first latch L1 to the third latch L3 as a first read data bit RD1. The column decoder 160 may also output a second column select signal Sel_C2 to a second multiplexer MUX2 based on the column address Addr_C and accordingly the second multiplexer MUX2 may output data stored in any one of the fourth latch L4 to the sixth latch L6 as a second read data bit RD2.

Figure 4:
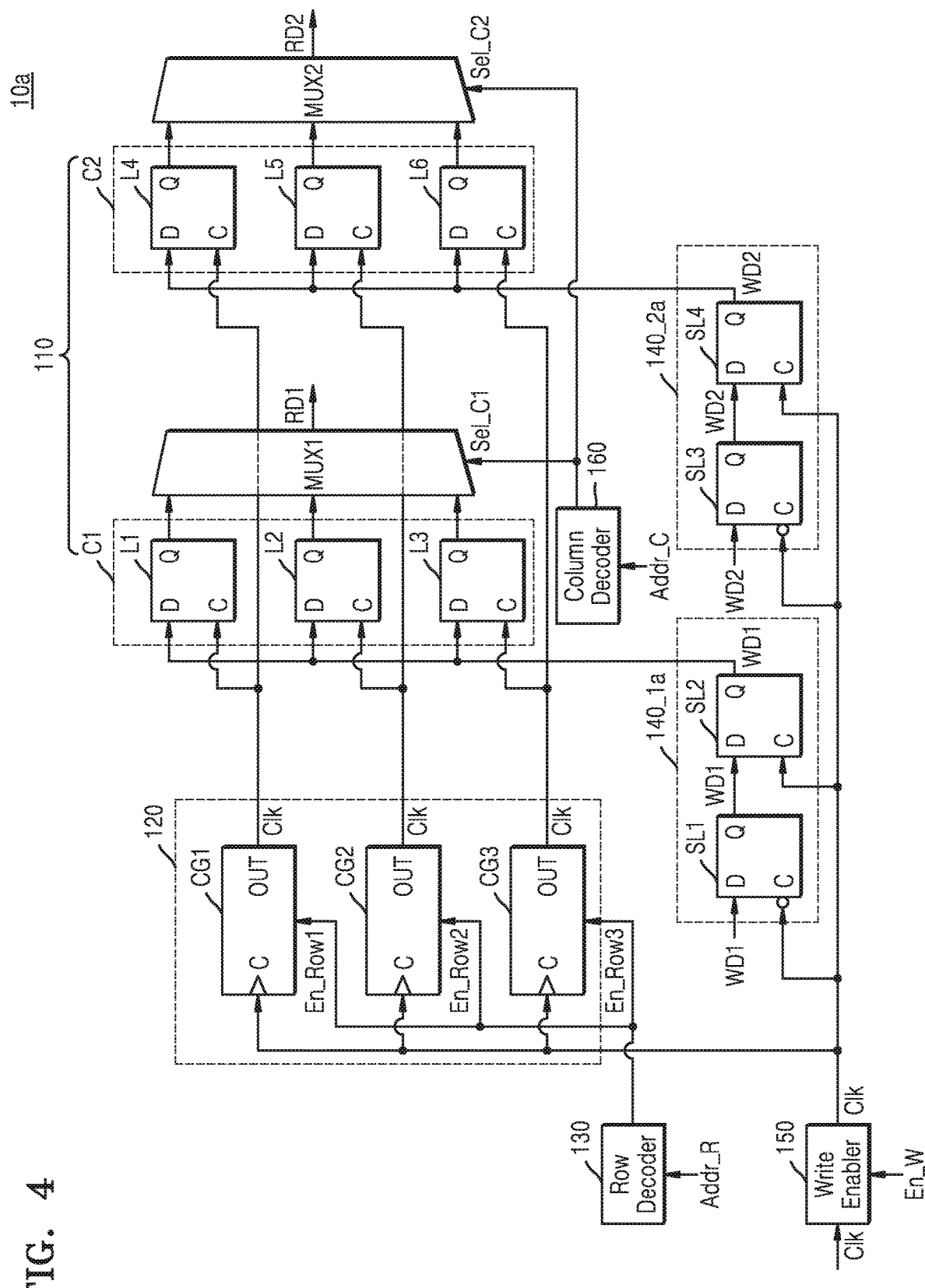
FIG. 4 is a circuit diagram illustrating a memory device according to embodiments of the inventive concept.

FIG. 4 is a circuit diagram illustrating a memory device 10a according to embodiments of the inventive concept. Redundant descriptions between FIGS. 3 and 4 will be omitted.

Referring to FIG. 4, the memory device 10a may include the memory cell array 110, the clock gating circuit 120, the row decoder 130, a first blocking circuit 140_1a, a second blocking circuit 140_2a, the write enabler 150 and the column decoder 160. The memory cell array 110, the clock gating circuit 120, the row decoder 130, the write enabler 150, and the column decoder 160 are described above with reference to FIG. 2, and thus descriptions thereof will be omitted.

The first blocking circuit 140_1a may include a first shared latch SL1 and a second shared latch SL2. The second blocking circuit 140_2a may include a third shared latch SL3 and a fourth shared latch SL4. The first shared latch SL1 and the second shared latch SL2 and the first latch L1 to the third latch L3 may operate in different phases of the clock Clk. For example, the first shared latch SL1 may be in a pass state in a first phase of the clock Clk and may be in a lock state in a second phase of the clock Clk. On the other hand, the second shared latch SL2 and the first latch L1 to the third latch L3 may be in the lock state in the first phase of the clock Clk and may be in the pass state in the second phase of the clock Clk.

The third shared latch SL3 and the fourth shared latch SL4 and the fourth latch L4 to the sixth latch L6 may operate in different phases of the clock Clk. For example, the third shared latch SL3 may be in the pass state in the first phase of the clock Clk, and may be in the lock state in the second phase of the clock Clk. On the other hand, the second shared latch SL2 and the first latch L1 to the third latch L3 may be in the lock state in the first phase of the clock Clk, and may be in the pass state in the second phase of the clock Clk.

The lock state may mean a state in which data storing a latch is not output to an output end Q, and the pass state may mean a state in which the data storing the latch is output to the output end Q. Alternatively, the lock state may mean a state in which an output signal maintains a previous level regardless of an input signal, and the pass state may mean a state in which the output signal is changed or maintained based on the input signal.

The memory device 10a according to an embodiment of the inventive concept may include the shared latches SL2 and SL4 that are in the lock state in the same phase as those of the plurality of latches L1 to L6 included in the memory cell array 110, thereby blocking a signal transmission with respect to the memory cell array 110 in a lock time section in which the plurality of latches L1 to L6 are in the lock state, and accordingly preventing power consumption due to the unnecessary signal transmission.

Figure 5:
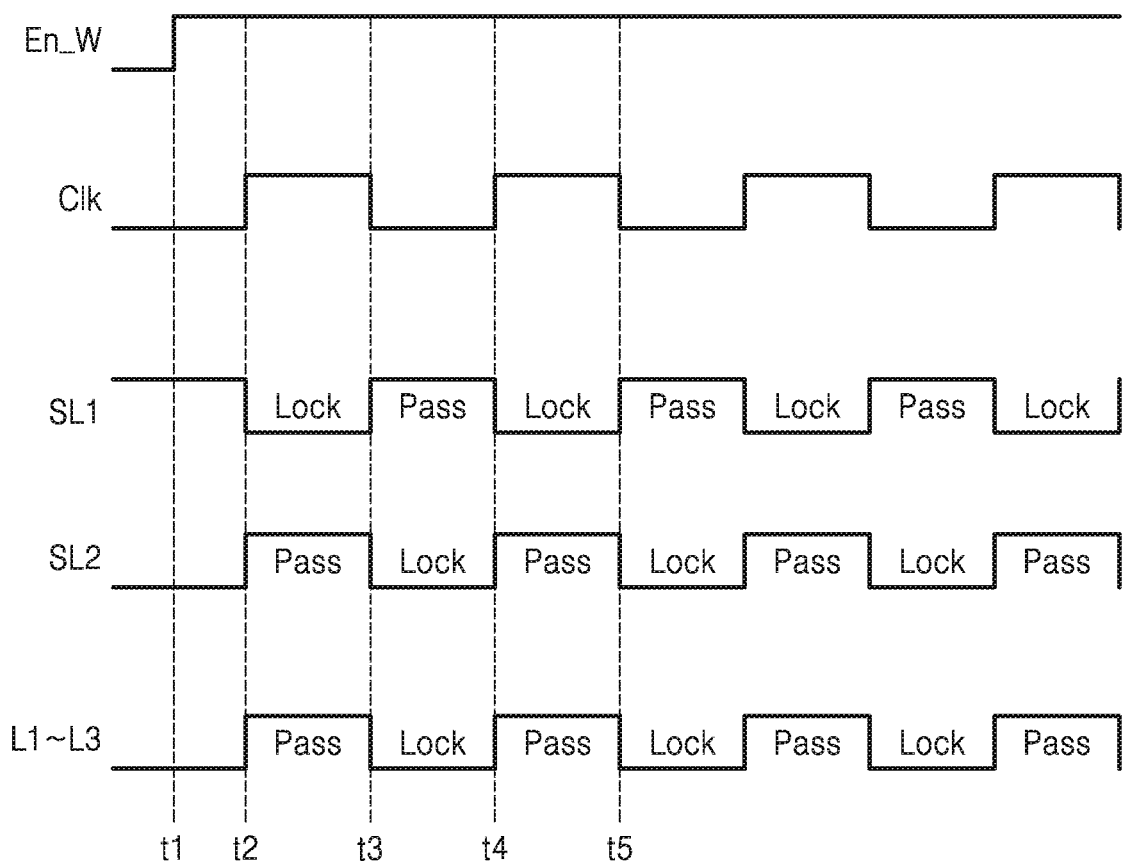
FIG. 5 is a timing diagram illustrating an operation of a memory device according to embodiments of the inventive concept.

FIG. 5 is a timing diagram illustrating an operation of a memory device according to embodiments of the inventive concept. More specifically, FIG. 5 is a timing diagram showing operations of the latches L1 to L3 included in a first column of a memory cell array and the shared latches SL1 and SL2 connected to the latches L1 to L3.

Referring to FIGS. 4 and 5, as the write enable signal En_W is transited from a first time point t1 to a first phase (for example, logic high), the clock Clk may be output to the first shared latch SL1, the second shared latch SL2, and the first latch L1 to the third latch L3.

Because the clock Clk is the first phase (for example, logic high) in a second time point t2 to a third time point t3, the first shared latch SL1 may be in a lock state, and the shared latch SL2 and the first latch L1 to the third latch L3 may be in a pass state.

Because the clock Clk is a second phase (for example, logic low) in the third time point t3 to a fourth time point t4, the first shared latch SL1 may be in the pass state, and the shared latch SL2 and the first latch L1 to the third latch L3 may be in the lock state.

Because the clock Clk is in the first phase (for example, logic high) in the fourth time point t4 to a fifth time point t5, the first shared latch SL1 may be in the lock state, and the shared latch SL2 and the first latch L1 to the third latch L3 may be in the pass state.

Figure 6A:
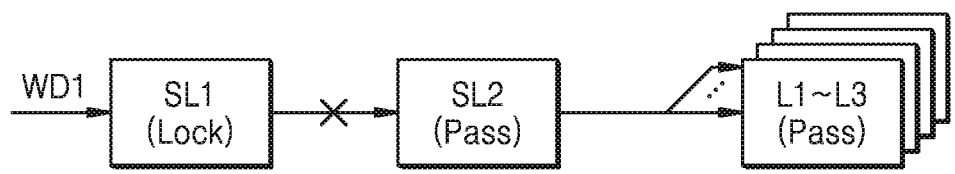
FIGS. 6A, 6B and 6C illustrate operations of a memory device according to embodiments of the inventive concept.
Figure 6B:
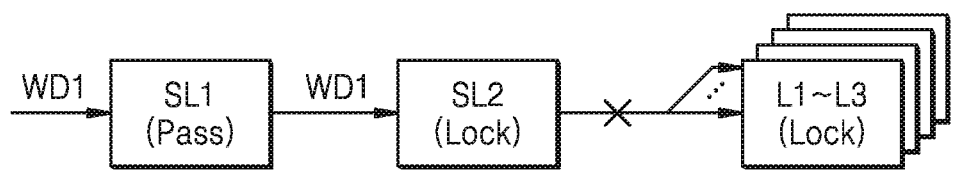
Figure 6C:
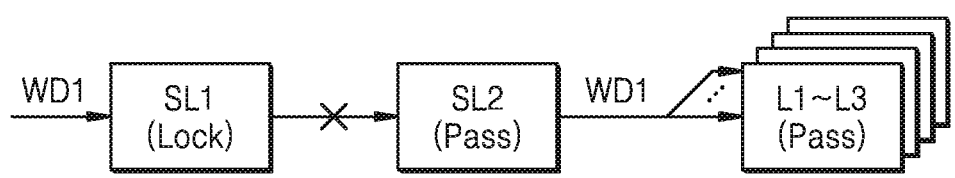

FIGS. 6A, 6B and 6C illustrate operations of a memory device according to embodiments of the inventive concept. More specifically, FIG. 6A shows the operation of the memory device at the second time point t2 and the third time point t3 in FIG. 4. FIG. 6B shows the operation of the memory device at the third time point t3 and the fourth time point t4 in FIG. 4. FIG. 6C shows the operation of the memory device at the fourth time point t4 and the fifth time point t5 in FIG. 4.

Referring to FIGS. 4 and 6A, as the first shared latch SL1 is in a lock state at the second time point t2 and the third time point t3, the first write data bit WD1 may be stored in the first shared latch SL1, and may not be transferred to the second shared latch SL2.

Referring to FIGS. 4 and 6B, as the first shared latch SL1 is converted into a pass state at the third time point t3 and the fourth time point t4, the first write data bit WD1 stored in the first shared latch SL1 may be transferred to the second shared latch SL2, and the second shared latch SL2 may store the first write data bit WD1.

Referring to FIGS. 4 and 6C, as the second shared latch SL2 is converted into the pass state at the fourth time point t4 and the fifth time point t5, the first write data bit WD1 stored in the second shared latch SL2 may be transferred from the first latch L1 to the third latch L3, and the first latch L1 to the third latch L3 may store the first write data bit WD1.

According to an embodiment of the inventive concept, because signals transferred to the plurality of latches L1 to L3 at the third time point t3 and the fourth time point t4 may be blocked by the second shared latch SL2, and thus a transfer of an unnecessary signal may be prevented, and accordingly, power consumption may be reduced.

Figure 7:
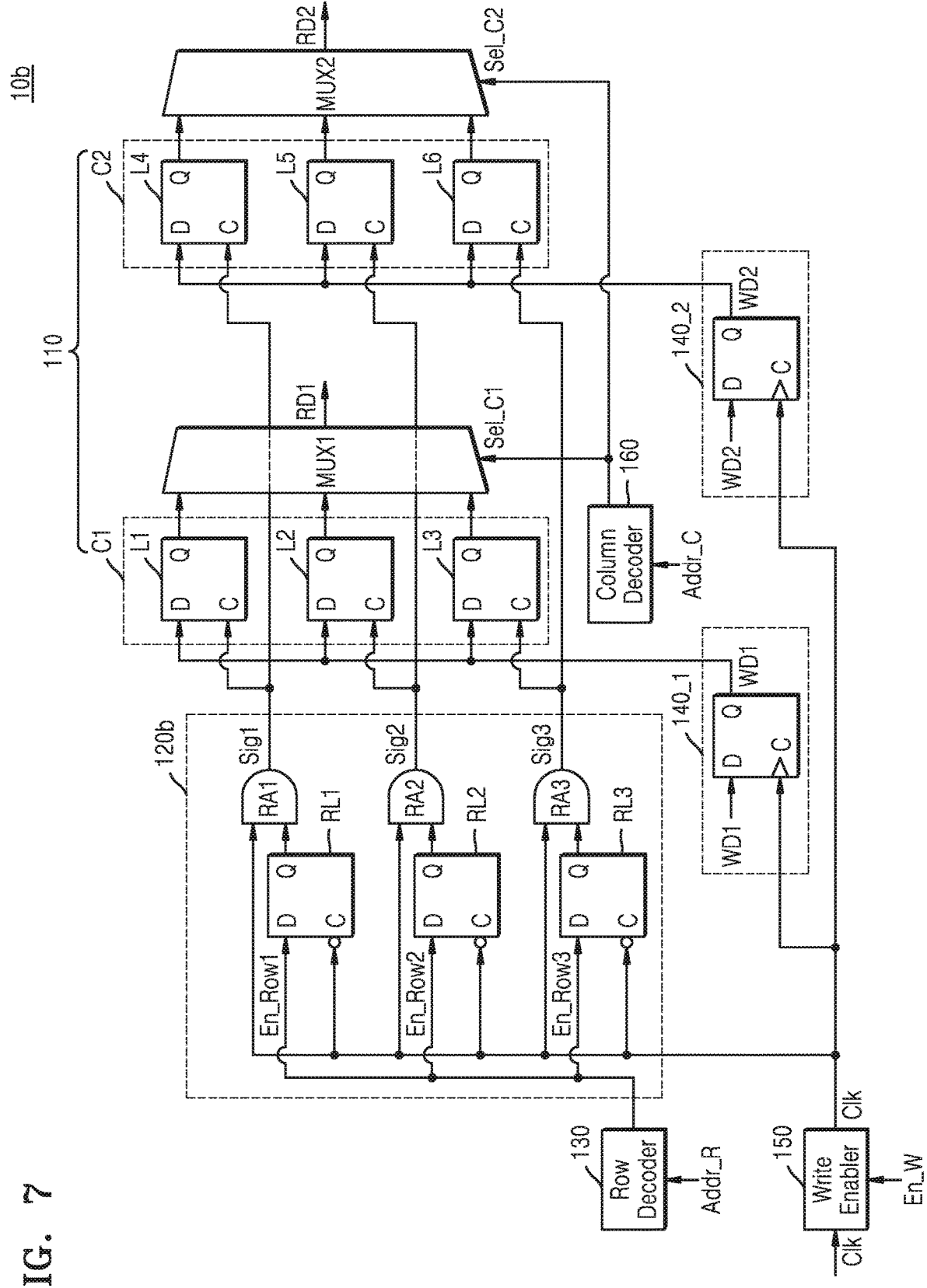
FIG. 7 is a circuit diagram illustrating a memory device according to embodiments of the inventive concept.

FIG. 7 is a circuit diagram illustrating a memory device 10b according to embodiments of the inventive concept. Redundant descriptions between FIGS. 3 and 7 are omitted.

Referring to FIG. 7, the memory device 10b may include a memory cell array 110, a clock gating circuit 120b, a row decoder 130, the blocking circuits 140_1 and 140_2, and the write enabler 150. The memory cell array 110, the row decoder 130, the blocking circuits 140_1 and 140_2, and the write enabler 150 are described above with reference to FIG. 3, and thus descriptions thereof will be omitted.

The clock gating circuit 120b may include a first row AND gate RA1, a second row AND gate RA2, a third row AND gate RA3, a first row latch RL1, a second row latch RL2, and a third row latch RL3.

The first row latch RL1 may output a first row enable signal En_Row1 to the first row AND gate RA1 based on the clock Clk received from the write enabler 150. The first row AND gate RA1 may be connected to the latches L1 and L4 arranged in a first row and may output the clock Clk received from the write enabler 150 and a first signal Sig1 generated through an AND operation on the first row enable signal En_Row1 received from the first row latch RL1 to the latches L1 and L4 arranged in the first row. As a result, the first row latch RL1 and the first row AND gate RA1 may output the clock Clk as the first signal Sig1 to the latches L1 and L4 arranged in the first row when the first row enable signal En_Row1 is present.

The second row latch RL2 may output a second row enable signal En_Row2 to the second row AND gate RA2 based on the clock Clk received from the write enabler 150. The second row AND gate RA2 may be connected to the latches L2 and L5 arranged in a second row and may output the clock Clk received from the write enabler 150 and a second signal Sig2 generated through the AND operation on the second row enable signal En_Row2 to the latches L2 and L5 arranged in the second row. As a result, the second row latch RL2 and the second row AND gate RA2 may output the clock Clk as the second signal Sig2 to the latches L2 and L5 arranged in the second row when the second row enable signal En_Row2 is present.

The third row latch RL3 may output a third row enable signal En_Row3 to the third row AND gate RA3 based on the clock Clk received from the write enabler 150. The third row AND gate RA3 may be connected to the latches L3 and L6 arranged in a third row and may output the clock Clk received from the write enabler 150 and a third signal Sig3 generated through the AND operation on the third row enable signal En_Row3 to the latches L3 and L6 arranged in the third row. As a result, the third row latch RL3 and the third row AND gate RA3 may output the clock Clk as the third signal Sig3 to the latches L3 and L6 arranged in the third row when the third row enable signal En_Row3 is present.

In an embodiment, the first row latch RL1 to the third row latch RL3 and the first latch L1 to the sixth latch L6 of the memory cell array 110 may operate in different phases of the clock Clk.

Figure 8:
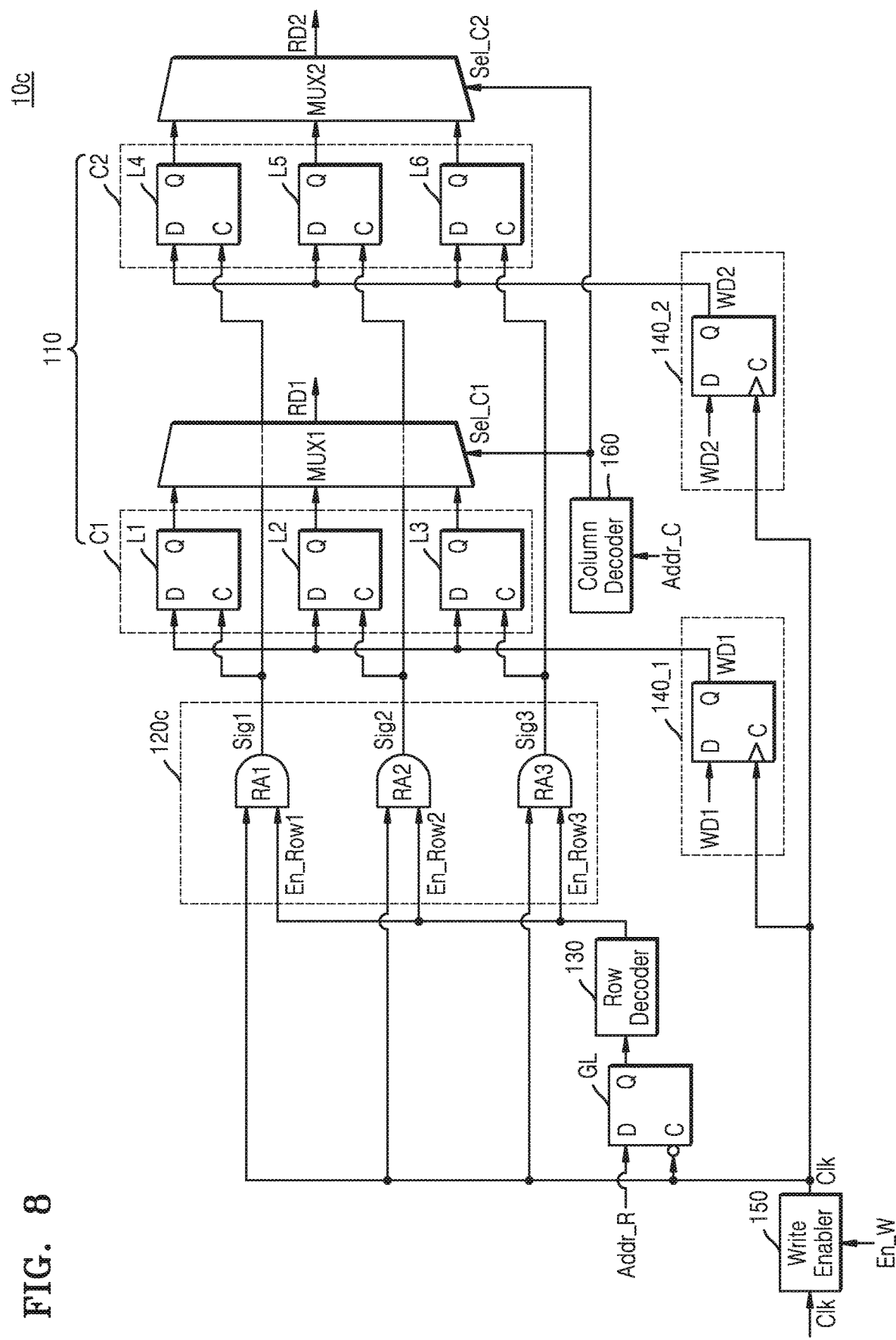
FIG. 8 is a circuit diagram illustrating a memory device according to embodiments of the inventive concept.

FIG. 8 is a circuit diagram illustrating a memory device 10c according to embodiments of the inventive concept. Redundant descriptions between FIGS. 7 and 8 are omitted.

Referring to FIG. 8, the memory device 10c may include the memory cell array 110, a clock gating circuit 120c, a gating latch GL, the row decoder 130, the blocking circuits 140_1 and 140_2, and the write enabler 150. The memory cell array 110, the row decoder 130, the blocking circuits 140_1 and 140_2, and the write enabler 150 are described above with reference to FIG. 3, and thus descriptions thereof will be omitted.

The gating latch GL may receive the row address Addr_R and output the row address Addr_R to the row decoder 130 based on the clock Clk received from the write enabler 150. In an embodiment, the gating latch GL and the first to sixth latches L1 to L6 included in the memory cell array 110 may operate in different phases of the clock Clk.

The row decoder 130 may output any one or any combination of the first row enable signal En_Row1 to the third row enable signal En_Row3 generated by decoding the row address Addr_R to the first row AND gate RA1 to the third row AND gate RA3, respectively. The first row AND gate RA1 to the third row AND gate RA3 may respectively output the first signal Sig1 to the third signal Sig3 generated based on the first row enable signal En_Row1 to the third row enable signal En_Row3 to the memory cell array 110.

Figure 9:
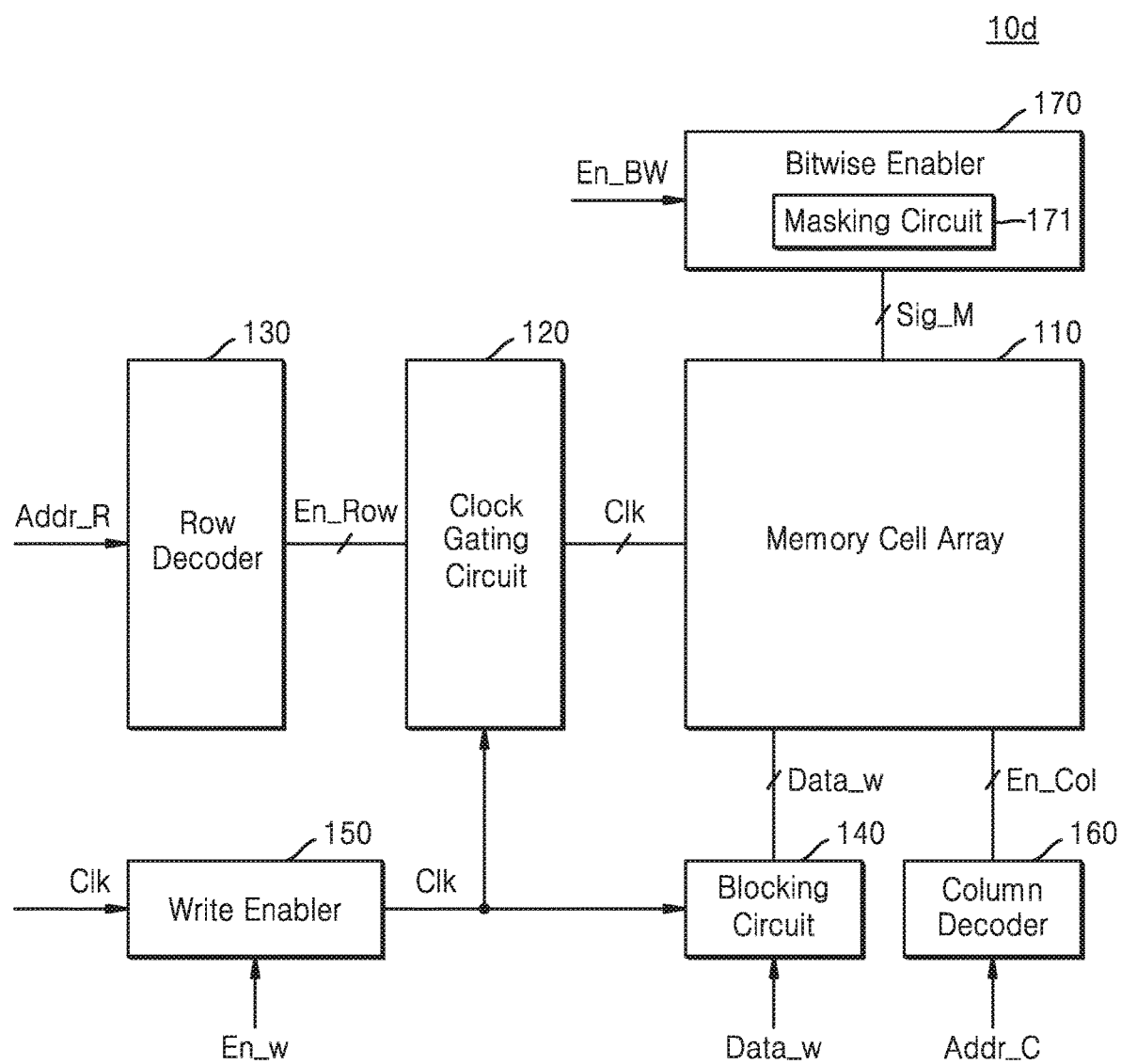
FIG. 9 is a block diagram illustrating a memory device according to embodiments of the inventive concept.

FIG. 9 is a block diagram illustrating a memory device 10d according to embodiments of the inventive concept. Redundant descriptions between FIGS. 2 and 9 will be omitted.

Referring to FIG. 9, the memory device 10d may include the memory cell array 110, the clock gating circuit 120, the row decoder 130, the blocking circuit 140, the write enabler 150, the column decoder 160 and a bitwise enabler 170. The memory cell array 110, the clock gating circuit 120, the row decoder 130, the blocking circuit 140, the write enabler 150 and the column decoder 160 are described above with reference to FIG. 2, and thus descriptions thereof are omitted.

The bitwise enabler 170 may include at least one masking circuit 171 connected to a row of memory cell arrays 110. The at least one masking circuit 171 may receive a bitwise enable signal En_BW from an outside (e.g., the CPU 11 of FIG. 1) and generate a masking signal Sig_M based on the bitwise enable signal En_BW. At least one latch included in the memory cell array 110 may be masked in correspondence with the masking signal Sig_M. The masked latch may be prevented from writing data. In an embodiment, the masking signal Sig_M may be generated for each bit of data.

The memory device 10d according to an embodiment of the inventive concept may perform data writing only on a plurality of latches that are not masked after performing masking for each bit, thereby preventing an unnecessary data write operation, and thus power consumption of the memory device 10d may be reduced and the data writing performance of the memory device 10d may be improved.

Figure 10A:
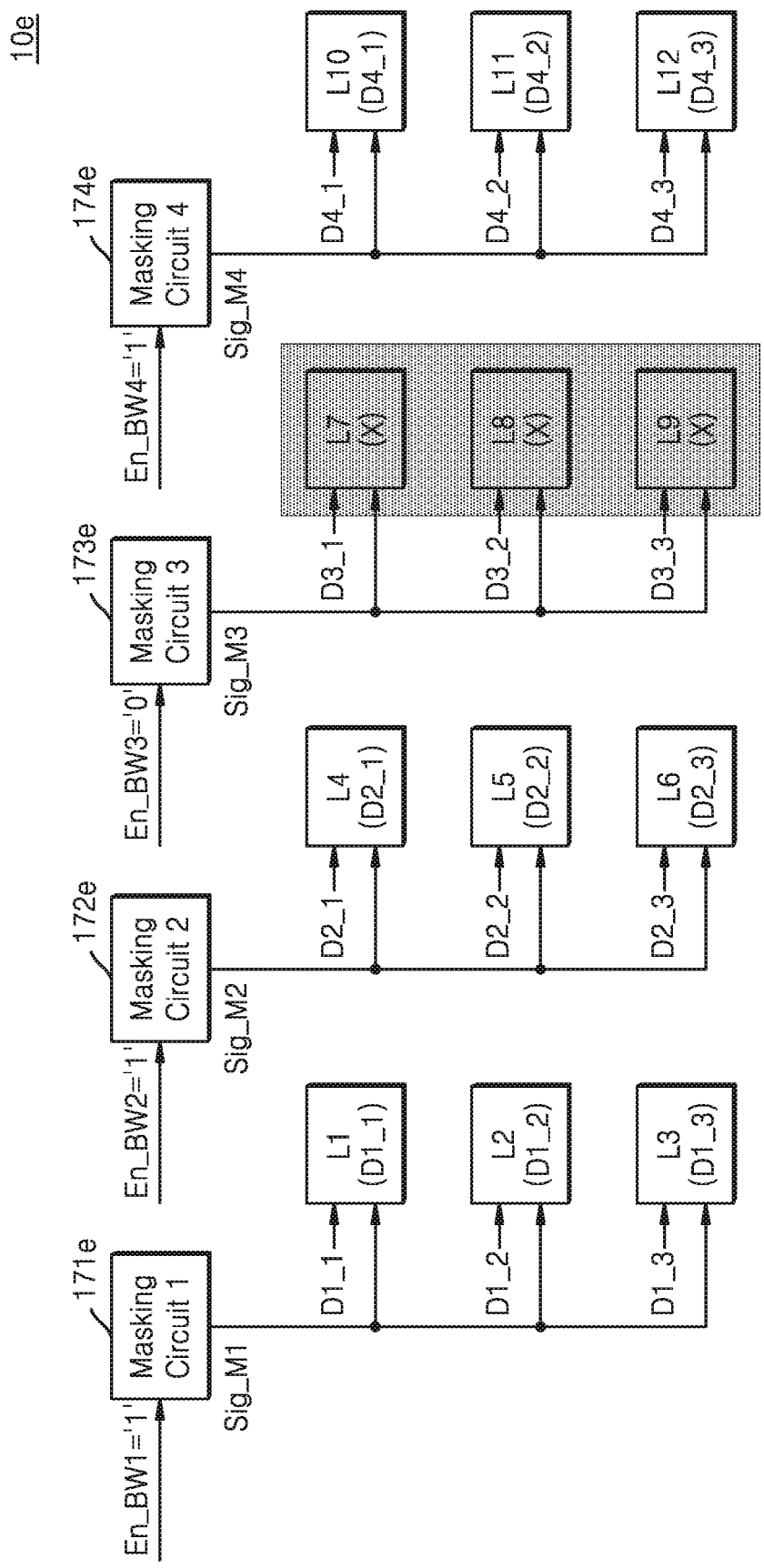
FIG. 10A is a block diagram illustrating a memory device according to embodiments of the inventive concept.

FIG. 10A is a block diagram illustrating a memory device 10e according to embodiments of the inventive concept.

Referring to FIG. 10A, the memory device 10e may include a first masking circuit 171e to a fourth masking circuit 174e and the first latch L1 to a twelfth latch L12. The first latch L1 and the twelfth latch L12 may constitute a memory cell array arranged in rows and columns.

The first masking circuit 171e may be connected to the latches L1, L2 and L3 arranged in a first column and may output a first masking signal Sig_M1 to the latches L1, L2 and L3 arranged in the first column based on a first bitwise enable signal En_BW1. The second masking circuit 172e may be connected to the latches L4, L5 and L6 arranged in a second column and may output a second masking signal Sig_M2 to the latches L4, L5 and L6 arranged in the second column based on a second bitwise enable signal En_BW2. The third masking circuit 173e may be connected to the latches L7, L8 and L9 arranged in a third column and may output a third masking signal Sig_M3 to the latches L7, L8 and L9 arranged in the third column based on a third bitwise enable signal En_BW3. The fourth masking circuit 174e may be connected to the latches L10, L11, and L12 arranged in a fourth column and may output a fourth masking signal Sig_M4 to the latches L10, L11, and L12 arranged in the fourth column based on a fourth bitwise enable signal En_BW4.

In an embodiment, data written to the memory device 10e may include 4 bits. First bits D1_1, D1_2, and D1_3 of the data may be written to the latches L1, L2, and L3 arranged in the first column. Second bits D2_1, D2_2 and D2_3 of the data may be written to the latches L4, L5 and L6 arranged in the second column. Also, third bits D3_1, D3_2 and D3_3 of the data may be written to the latches L7, L8 and L9 arranged in the third column. Fourth bits D4_1, D4_2 and D4_3 of the data arranged in the fourth column may be written to the latches L10, L11, and L12.

In the example of FIG. 10A, as '1' is output as the first bitwise enable signal En_BW1, the second bitwise enable signal En_BW2, and the fourth bitwise enable signal En_BW4, the data may be written to the latches L1, L2, L3, L4, L5, L6, L10, L11, and L12 arranged in the second column and the fourth column. On the other hand, as '0' is output as the third bitwise enable signal En_BW3, masking may be performed on the latches L7, L8 and L9 arranged in the third column and the data may not written and the existing data may be preserved.

The memory device 10e according to an embodiment of the inventive concept may prevent an unnecessary write operation by masking latches arranged in at least one column.

Figure 10B:
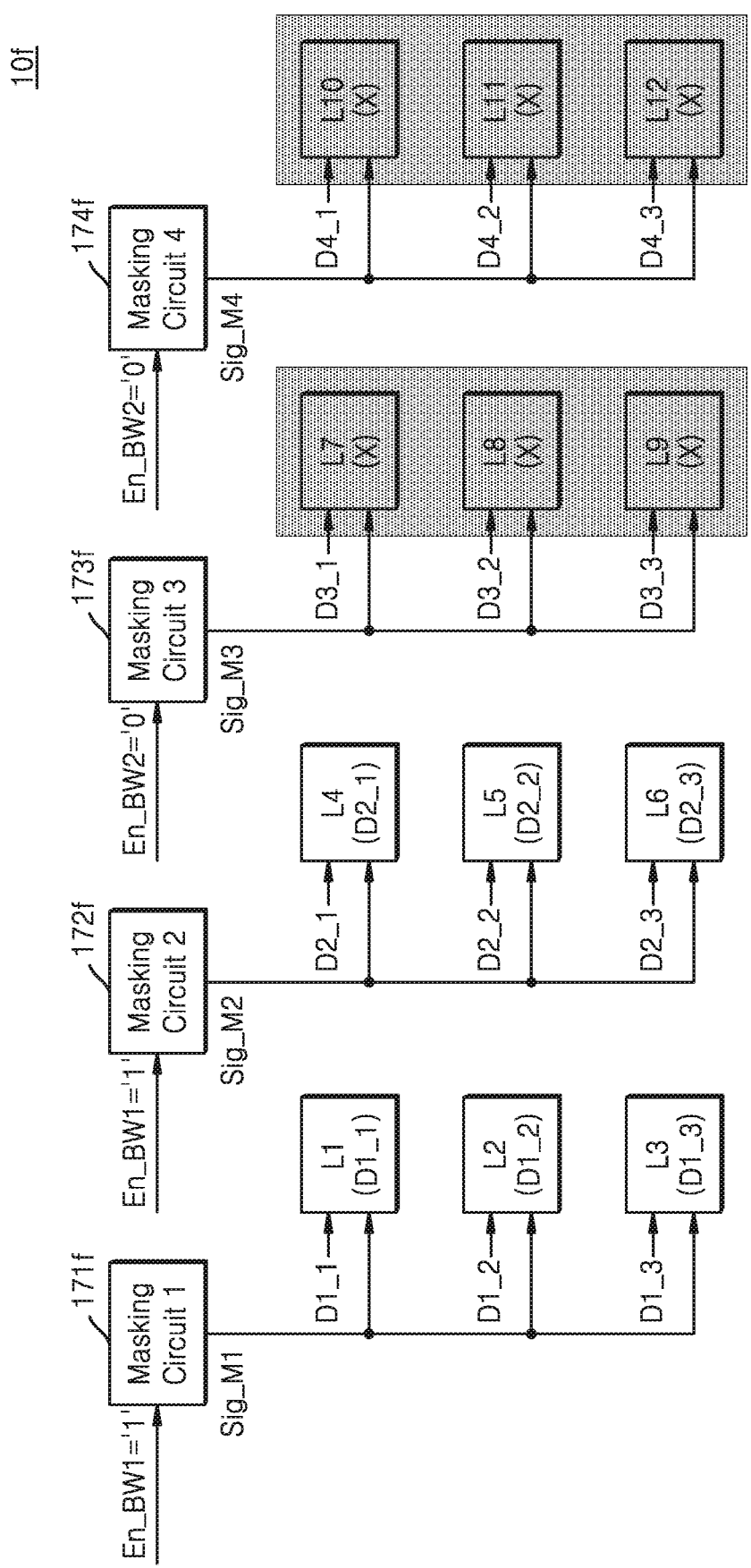
FIG. 10B is a block diagram illustrating a memory device according to embodiments of the inventive concept.

FIG. 10B is a block diagram illustrating a memory device 10f according to embodiments of the inventive concept. In detail, FIG. 10B may show an embodiment in which 2-bit masking is performed. Redundant descriptions between FIGS. 10A and 10B are omitted.

Referring to FIG. 10B, the memory device 10f may include a first masking circuit 171f to a fourth masking circuit 174f and the first latch L12 to the twelfth latch L12. The first latch L1 and the twelfth latch L12 may constitute a memory cell array arranged in rows and columns.

The first masking circuit 171f and the second masking circuit 172f may mask the latches L1, L2 and L3 arranged in a first column or the latches L4, L5 and L6 arranged in a second column based on the first bitwise enable signal En_BW1. The third masking circuit 173f and the fourth masking circuit 174f may mask the latches L7, L8 and L9 arranged in a third column or the latches L10, L11 and L12 arranged in a fourth column based on the second bitwise enable signal En_BW2.

In the example of FIG. 10B, as '1' is output as the first bitwise enable signal En_BW1, data writing may be performed on the latches L1, L2, L3, L4, L5, and L6 arranged in the first column and the second column. On the other hand, as '0' is output as the second bitwise enable signal En_BW2, masking may be performed on the latches L7, L8, L9, L10, L11 and L12 arranged in the third column and the fourth column, data writing may not be performed, and the existing data may be preserved.

FIG. 10B shows an embodiment in which masking is performed every two bits, but this is only an embodiment. The technical idea of the inventive concept may also be applied to an embodiment in which masking is performed with bits more or less than 2 bits.

Figure 10C:
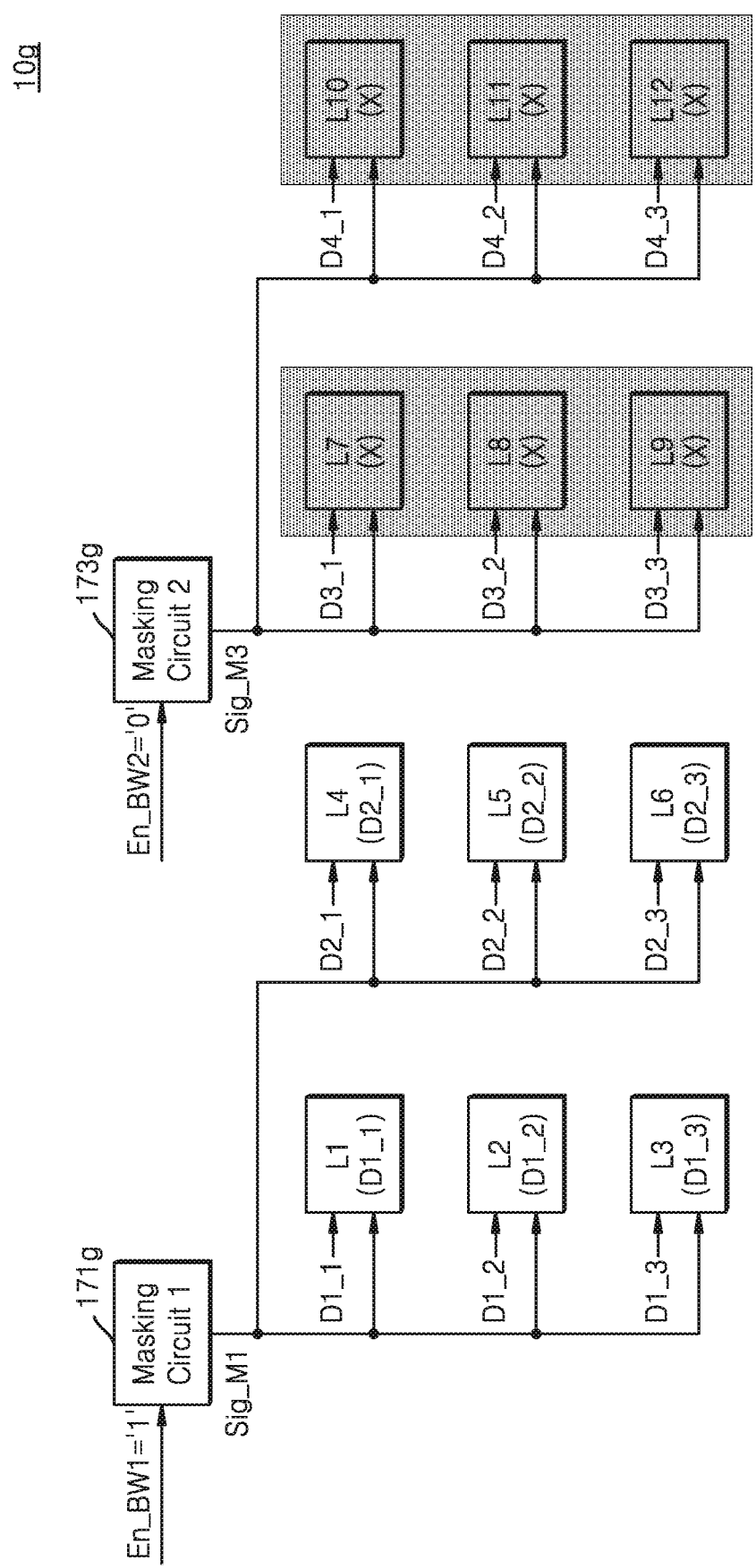
FIG. 10C is a block diagram illustrating a memory device according to embodiments of the inventive concept.

FIG. 10C is a block diagram illustrating a memory device 10g according to embodiments of the inventive concept. FIG. 10C may show latches arranged in a plurality of columns connected to one masking circuit. Redundant descriptions between FIGS. 10B and 10C are omitted.

Referring to FIG. 10C, the memory device 10g may include a first masking circuit 171g, a second masking circuit 173g, and the first latch L12 to the twelfth latch L12.

The first masking circuit 171g may mask the latches L1, L2, L3, L4, L5, and L6 arranged in first and second columns based on the first bitwise enable signal En_BW1. The second masking circuit 173g may mask the latches L7, L8, L9, L10, L11, and L12 arranged in third and fourth columns based on the second bitwise enable signal En_BW2.

In the example of FIG. 10C, as '1' is output as the first bitwise enable signal En_BW1, data writing may be performed on the latches L1, L2, L3, L4, L5, and L6 arranged in the first column and the second column. On the other hand, as '0' is output as the second bitwise enable signal En_BW2, the second masking circuit 173g may perform masking on the latches L7, L8, L9, L10, L11, and L12 arranged in the third column and the fourth column, data writing may not be performed on the latched L8, L9, L10, L11, and L12 arranged in the third column and the fourth column, and the existing data may be preserved.

FIG. 10C shows an embodiment in which masking is performed every two bits, this is only an embodiment. More than two columns may be connected to one masking circuit 171g or 173g to perform masking using more than 2 bits.

Figure 11:
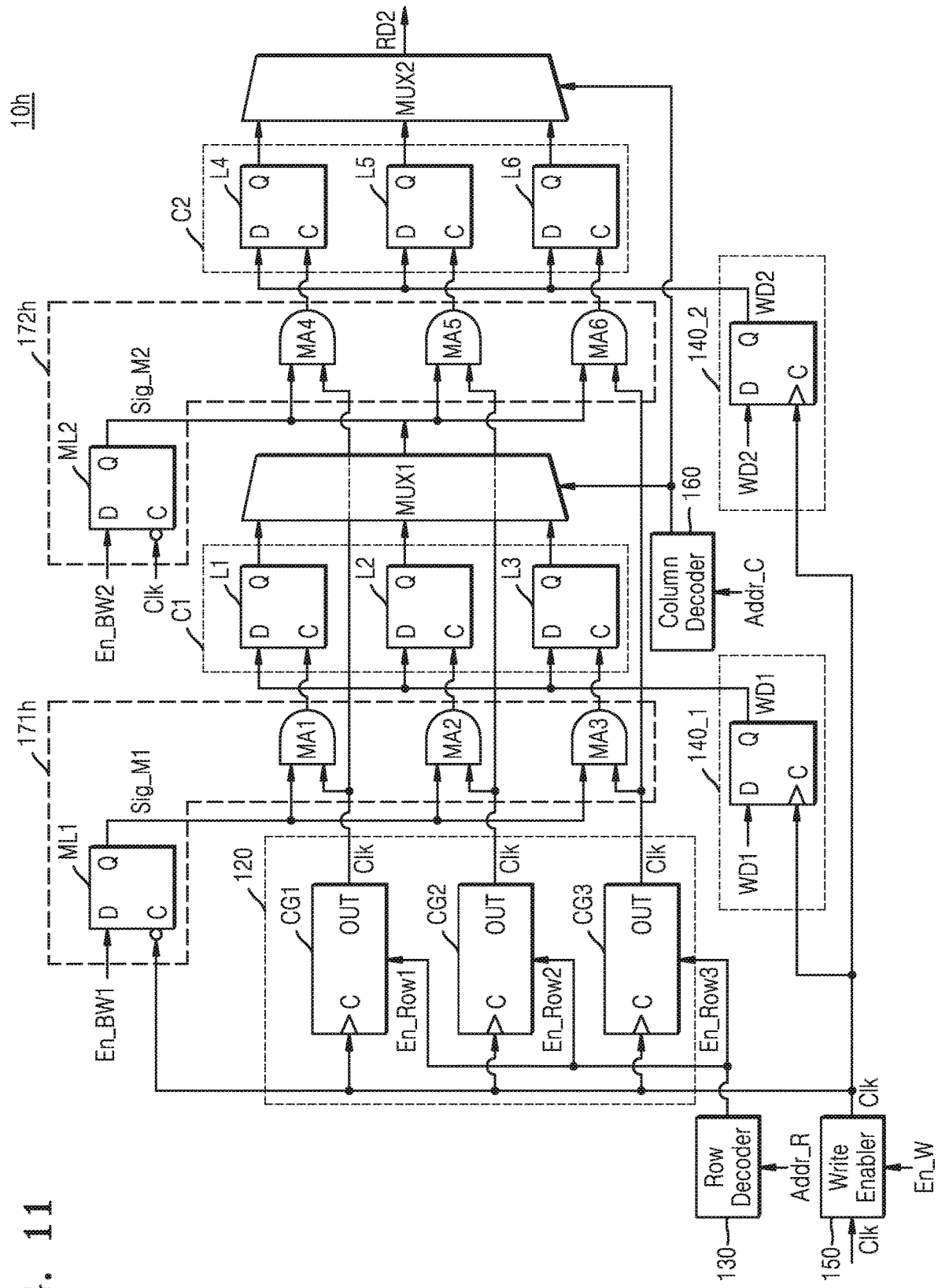
FIG. 11 is a circuit diagram illustrating a memory device according to embodiments of the inventive concept.

FIG. 11 is a circuit diagram illustrating a memory device 10h according to embodiments of the inventive concept. Redundant descriptions between FIGS. 3 and 11 are omitted.

Referring to FIG. 11, the memory device 10h may include the plurality of latches L1 to L6, the clock gating circuit 120, the row decoder 130, the first blocking circuit 140_1, the second blocking circuit 140_2, the write enabler 150, the column decoder 160, a first masking circuit 171h, and a second masking circuit 172h. The plurality of latches L1 to L6, the clock gating circuit 120, the row decoder 130, the first blocking circuit 140_1, the second blocking circuit 140_2, the write enabler 150, and the column decoder 160 are described above with reference to FIG. 3, and thus descriptions thereof will be omitted.

The first masking circuit 171h may include a first masking latch ML1 and a first masking AND gate MA1 to a third masking AND gate MA3. The second masking circuit 172h may include a second masking latch ML2 and a fourth masking AND gate MA4 to a sixth masking AND gate MA6.

The first masking latch ML1 may receive the first bitwise enable signal En_BW1 and may output the first masking signal Sig_M1 generated based on the clock Clk to the first masking AND gate MA1 to the third masking AND gate MA3. In an embodiment, the first masking latch ML1 and the first latch L1 through the sixth latch L6 may operate in different phases of the clock Clk.

The first masking AND gate MA1 to the third masking AND gate MA3 may output the clock Clk received from the first masking signal CG1 to the third clocking gate CG3 only when the first masking signal Sig_M1 is '1'. As a result, when the first masking signal Sig_M1 output from the first masking latch ML1 is '0', the clock signal CLK output to the latches L1, L2 and L3 included in a first column C1 may be blocked by the first masking AND gate MA1 to the third masking AND gate MA3, and as a result, data may not be written to the latches L1, L2, L3 included in the first column C1.

The second masking latch ML2 may receive the second bitwise enable signal En_BW2 and may output the second masking signal Sig_M1 generated based on the clock Clk to the fourth masking AND gate MA4 to the sixth masking AND gate MA6. In an embodiment, the second masking latch ML2 and the first latch L1 through the sixth latch L6 may operate in different phases of the clock Clk.

The fourth masking AND gate MA4 to the sixth masking AND gate MA6 may output the clock Clk received from the first masking signal CG1 to the third clocking gate CG3 only when the second masking signal Sig_M2 is '1'. As a result, when the second masking signal Sig_M2 output from the second masking latch ML2 is '0', the clock signal CLK output to the latches L4, L5 and L6 included in a second column C2 may be blocked by the fourth masking AND gate MA4 to the sixth masking AND gate MA6, and as a result, data may not be written to the latches L4, L5 and L6 included in a second column C2.

Figure 12:
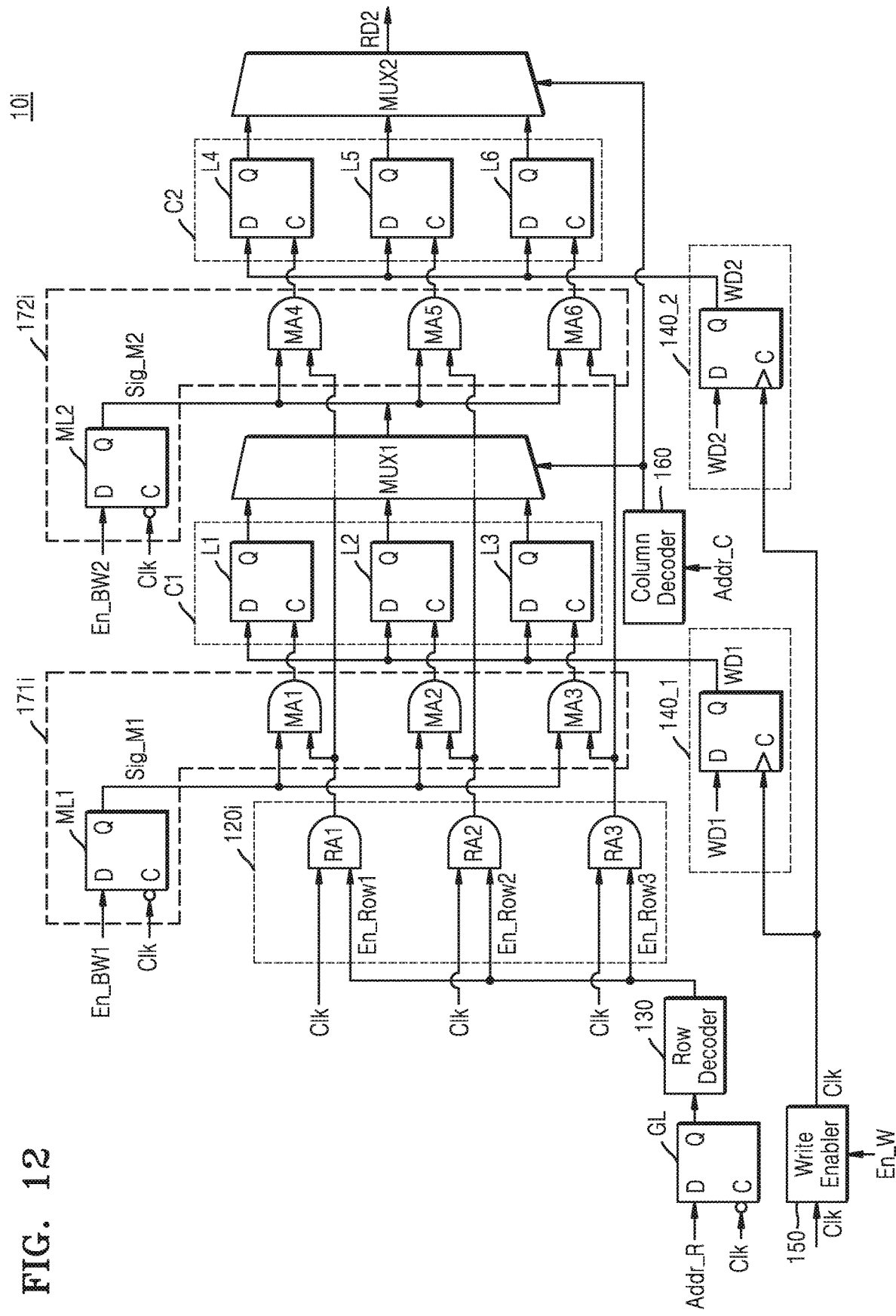
FIG. 12 is a circuit diagram illustrating a memory device according to embodiments of the inventive concept.

FIG. 12 is a circuit diagram illustrating a memory device 10$i$ according to embodiments of the inventive concept. Redundant descriptions between FIGS. 8, 11 and 12 are omitted.

Referring to FIG. 12, the memory device 10$i$ may include the plurality of latches L1 to L6, a clock gating circuit 120$i$, the row decoder 130, the first blocking circuit 140_1, the second blocking circuit 140_2, the write enabler 150, the column decoder 160, a first masking circuit 171$i$, a second masking circuit 172$i$, and a gating latch GL. The plurality of latches L1 to L6, the row decoder 130, the first blocking circuit 140_1, the second blocking circuit 140_2, the write enabler 150, the column decoder 160, the first masking circuit 171$i$, and the second masking circuit 172$i$ are described above with reference to FIG. 11, etc. and thus descriptions thereof will be omitted.

The gating latch GL may output the row address Addr_R to the row decoder 130 based on the clock Clk. The row decoder 130 may output any one or any combination of the enable signal En_Row1 to the third row enable signal En_Row3 generated by decoding the row address Addr_R to the first row AND gate RA1 to the third row AND gate RA3.

The first row AND gate RA1 to the third row AND gate RA3 may output the clock Clk received from the write enabler 150 to the first masking AND gate MA1 to the sixth masking AND gate MA6 based on the first row enable signal En_Row1 to the third row enable signal En_Row3. The first masking AND gate MA1 to the sixth masking AND gate MA6 may output the clock Clk to the first latch L1 to the sixth latch L6 based on the masking signals Sig_M1 and Sig_M2.

Figure 13:
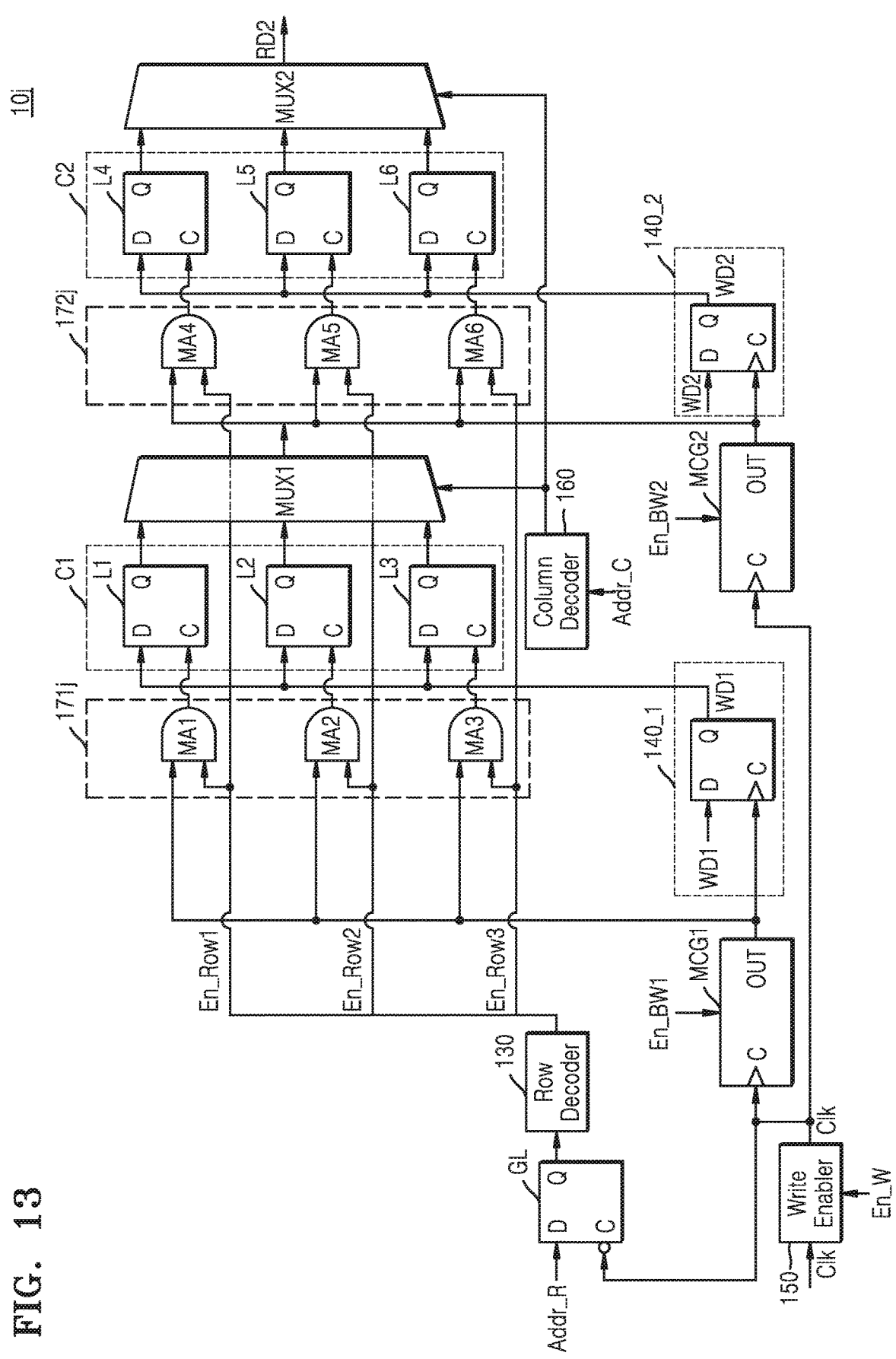
FIG. 13 is a circuit diagram illustrating a memory device according to embodiments of the inventive concept.

FIG. 13 is a circuit diagram illustrating a memory device 10$j$ according to embodiments of the inventive concept. Redundant descriptions between FIGS. 11 and 13 are omitted.

Referring to FIG. 13, the memory device 10$j$ may include the plurality of latches L1 to L6, the row decoder 130, the first blocking circuit 140_1, the second blocking circuit 140_2, the write enabler 150, the column decoder 160, a first masking clock gate MCG1, a second masking clock gate MCG2, a first masking circuit 171$j$, a second masking circuit 172$j$, and the gating latch GL. The plurality of latches L1 to L6, the row decoder 130, the first blocking circuit 140_1, the second blocking circuit 140_2, the write enabler 150, the column decoder 160, and the gating latch GL are described above with reference to FIGS. 11 and 12, etc. and thus descriptions thereof will be omitted.

The first masking clock gate MCG1 may receive the clock Clk from the write enabler 150 and output the clock Clk to the first blocking circuit 140_1 and the second blocking circuit 140_1 based on the first bitwise enable signal En_BW1 and the first masking circuit 171$j$. The first blocking circuit 140_1 may output the first write data bit WD1 to the latches L1, L2 and L3 arranged in the first column C1 based on the clock Clk.

The first masking circuit 171$j$ may include the first masking AND gate MA1 to the third masking AND gate MA3. The first masking AND gate MA1 to the third masking AND gate MA3 may output the clock Clk received from the first masking clock gate MCG1 to the first latch L1 to the third latch L3 based on the first row enable signal En_Row1 to the third row enable signal En_Row3.

The second masking clock gate MCG2 may receive the clock Clk from the write enabler 150 and may output the clock Clk to the second blocking circuit 140_2 and the second masking circuit 172$j$ based on the second bitwise enable signal En_BW2. The first blocking circuit 140_1 may output the second write data bit WD2 to the latches L4, L5 and L6 arranged in the second column C2 based on the clock Clk.

The second masking circuit 172$j$ may include the fourth masking AND gate MA4 to the sixth masking AND gate MA6. The fourth masking AND gate MA4 to the sixth masking AND gate MA6 may output the clock Clk received from the second masking clock signal MCG2 to the fourth latch L4 to the sixth latch L6 based on the fourth row enable signal En_Row4 to the sixth row enable signal En_Row6.

The masking clock gates MCG1 and MCG2 according to an embodiment of the inventive concept may control the blocking circuits 140_1 and 140_2 and the masking circuits 171$j$ and 172$j$ based on the bitwise enable signals En_BW1 and En_BW2, and thus data writing may be performed for each bit.

Figure 14:
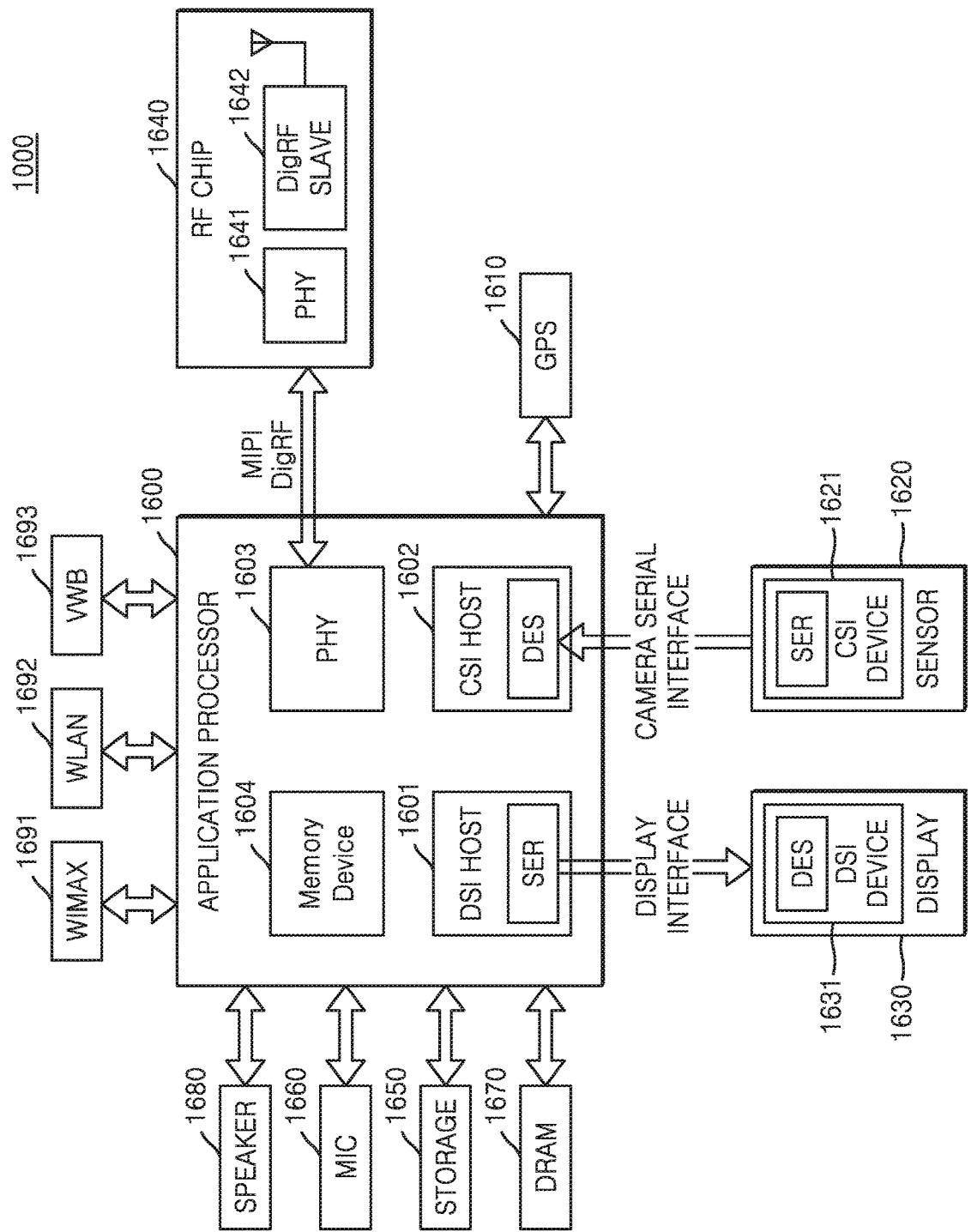
FIG. 14 is a block diagram illustrating an interface used in a computing system according to embodiments of the inventive concept.

FIG. 14 is a block diagram illustrating an interface used in a computing system 1000 according to embodiments of the inventive concept.

Referring to FIG. 14, the computing system 1000 may be implemented as a data processing device capable of using or supporting a MIPI interface and may include an application processor (AP) 1600, an image sensor 1620, a display 1630, etc. A camera serial interface (CSI) host 1602 of the AP 1600 may perform serial communication with a CSI device 1621 of the image sensor 1620 through a CSI. In an embodiment, the CSI host 1602 may include a deserializer DES, and the CSI device 1621 may include a serializer SER.

A display serial interface (DSI) host 1602 of the AP 1600 may perform serial communication with a DSI device 1631 of the display 1630 through a DSI. In an embodiment, the DSI host 1601 may include the serializer SER, and the DSI device 1631 may include the deserializer DES. The computing system 1000 may further include a radio frequency (RF) chip 1640 capable of communicating with the AP 1600. A PHY 1603 of the AP 1600 and a PHY 1641 of the RF chip 1640 may perform data transmission and reception according to a mobile industry processor interface (MIPI) DigRF 1642. Also, the AP 1600 may further include a memory device 1604. The memory device 1604 may include a blocking circuit to block signal transmission with respect to a plurality of latches in a lock time section in which the plurality of latches do not operate, as described above with reference to FIGS. 1 to 13. Also, the memory device 1604 may include a masking circuit to control the plurality of latches such that some of bits of data are not written.

The computing system 1000 may further include a global positioning system (GPS), storage 1650, a microphone 1660, a dynamic random access memory (DRAM) 1670, and a speaker 1680. Also, the computing system 1000 may perform communication using ultra wideband (UWB) 1693, wireless local area network (WLAN) 1692, and worldwide interoperability for microwave access (WIMAX) 1691. However, the structure and the interface of the computing system 1000 are not limited thereto.

While the inventive concept has been shown and described with reference to embodiments thereof, it will be understood that various changes in form and details may be made therein without departing from the spirit and scope of the following claims.

What is claimed is:

1. A circuit comprising:
a plurality of latches arranged in a plurality of columns comprising a first column and a second column and in a plurality of rows, each of the plurality of latches being configured to store at least one bit of data;
a first flip flop configured to output first data, to first latches arranged in the first column, among the plurality of latches, based on a clock; and
a second flip flop configured to output second data, to second latches arranged in the second column, among the plurality of latches, based on the clock,
wherein the first flip flop is further configured to, in a lock time section in which the first latches and the second latches are in a lock state, block output of the first data to the first latches, and
wherein the second flip flop is further configured to, in the lock time section, block output of the second data to the second latches.

2. The circuit of claim 1, wherein the first flip flop comprises:
a first shared latch configured to output the first data that is received, based on a first phase of the clock; and
a second shared latch configured to output the first data that is received from the first shared latch, based on a second phase of the clock, to the first latches, and
wherein the plurality of latches are configured to output the first data that is received from the second shared latch, based on the second phase.

3. The circuit of claim 1, further comprising:
a write enabler configured to output the clock to the first flip flop and the second flip flop, based on a write enable signal; and
a column decoder configured to control to read data from the plurality of latches by decoding a column address.

4. The circuit of claim 1, wherein the plurality of rows comprises a first row and a second row,
wherein the circuit further comprises:
a row decoder configured to generate a row enable signal by decoding a row address;
a first clock gate configured to output the clock to third latches arranged in the first row, among the plurality of latches, based on the row enable signal that is received from the row decoder; and
a second clock gate configured to output the clock to fourth latches arranged in the second row, among the plurality of latches, based on the row enable signal that is received from the row decoder, and
wherein each of the first clock gate and the second clock gate comprises a latch and an AND gate.

5. The circuit of claim 1, wherein the plurality of rows comprises a first row and a second row, and
wherein the circuit further comprises:
a first gating latch configured to output a row address, based on the clock;
a row decoder configured to generate a row enable signal by decoding the row address that is received from the first gating latch;
a first row AND gate configured to generate a first signal, based on a first AND operation on the clock and the row enable signal that is received from the row decoder, and output the first signal to third latches arranged in the first row, among the plurality of latches; and
a second row AND gate configured to generate a second signal, based on a second AND operation on the clock and the row enable signal that is received from the row decoder, and output the second signal to fourth latches arranged in the second row, among the plurality of latches.

6. The circuit of claim 1, further comprising:
a first masking circuit configured to mask the first latches arranged in the first column, based on a first bit enable signal; and
a second masking circuit configured to mask the second latches arranged in the second column, based on a second bit enable signal,
wherein each of the first latches is further configured to, when masked by the first masking circuit, receive the first data from the first flip flop, without storing the first data, and
wherein each of the second latches is further configured to, when masked by the second masking circuit, receive the second data from the second flip flop, without storing the second data.

7. The circuit of claim 6, further comprising:
a row decoder configured to generate a row enable signal by decoding a row address; and
a plurality of row AND gates, each of the plurality of row AND gates being configured to output the clock for a respective one of the plurality of rows, based on an AND operation on a latch clock and the row enable signal that is received from the row decoder,
wherein the first masking circuit comprises:
a first masking latch configured to output the first bit enable signal, based on the clock; and
a plurality of first masking AND gates, each of the plurality of first masking AND gates being configured to output, to the first latches arranged in the first column, the first bit enable signal that is received from the first masking latch, based on the latch clock that is received respectively from the plurality of row AND gates.

8. The circuit of claim 6, further comprising:
a row decoder configured to generate a row enable signal by decoding a row address; and
a first masking clock gate configured to output a first masking clock, based on the first bit enable signal,
wherein the first masking circuit comprises a plurality of first masking AND gates, each of the plurality of first masking AND gates being configured to output, to the first latches arranged in the first column, a latch clock based on the first masking clock and the row enable signal that is received from the row decoder.

9. The circuit of claim 8, further comprising a second masking clock gate configured to output a second masking clock, based on the second bit enable signal,
wherein the first flip flop is further configured to receive the first masking clock, from the first masking clock gate, and
wherein the second flip flop is further configured to receive the second masking clock, from the second masking clock gate.

10. A system on chip comprising:
a central processing unit (CPU) configured to write first data to a plurality of latches through access to the plurality of latches; and
a memory device configured to store the first data in correspondence to the access of the CPU,
wherein the memory device comprises:
the plurality of latches arranged in a plurality of columns comprising a first column and in a plurality of rows, each of the plurality of latches being configured to store at least one bit of data; and
a first blocking circuit configured to:
output at least some bits of the first data, to first latches arranged in the first column, among the plurality of latches, based on a clock; and
block a signal that is applied to the first latches arranged in the first column, in a lock time section in which the first latches arranged in the first column are in a lock state.

11. The system on chip of claim 10, wherein the first blocking circuit comprises:
a first shared latch configured to output the first data that is received, based on a first phase of the clock; and
a second shared latch configured to output the first data that is received from the first shared latch, based on a second phase of the clock, to the first latches, and
wherein the plurality of latches are configured to output the first data that is received from the second shared latch, based on the second phase.

12. The system on chip of claim 10, wherein the memory device further comprises a second blocking circuit configured to:
output at least some bits of second data, to second latches arranged in a second column, among the plurality of latches, based on the clock; and
block a signal that is applied to the second latches arranged in the second column, in the lock time section in which the second latches arranged in the second column maintain output data of the second latches.

13. The system on chip of claim 12, wherein the plurality of rows comprises a first row and a second row,
wherein the system on chip further comprises:
a row decoder configured to generate a row enable signal by decoding a row address;
a first clock gate configured to output the clock to third latches arranged in the first row, among the plurality of latches, based on the row enable signal that is received from the row decoder; and
a second clock gate configured to output the clock to fourth latches arranged in the second row, among the plurality of latches, based on the row enable signal that is received from the row decoder, and
wherein each of the first clock gate and the second clock gate comprises a latch and an AND gate.

14. The system on chip of claim 12, wherein the plurality of rows comprises a first row and a second row, and
wherein the system on chip further comprises:
a first gating latch configured to output a row address, based on the clock;
a row decoder configured to generate a row enable signal by decoding the row address that is received from the first gating latch;
a first row AND gate configured to generate a first signal, based on a first AND operation on the clock and the row enable signal that is received from the row decoder, and output the first signal to third latches arranged in the first row, among the plurality of latches; and
a second row AND gate configured to generate a second signal, based on a second AND operation on the clock and the row enable signal that is received from the row decoder, and output the second signal to fourth latches arranged in the second row, among the plurality of latches.

15. The system on chip of claim 12, further comprising:
a first masking circuit configured to mask the first latches arranged in the first column, based on a first bit enable signal; and
a second masking circuit configured to mask the second latches arranged in the second column based on a second bit enable signal,
wherein each of the first latches is further configured to, when masked by the first masking circuit, receive the first data from the first blocking circuit, without storing the first data, and
wherein each of the second latches is further configured to, when masked by the second masking circuit, receive the second data from the second blocking circuit, without storing the second data.

16. A memory device comprising:
a plurality of latches arranged in a plurality of columns and a plurality of rows, each of the plurality of latches being configured to store at least one bit of data;
a bitwise enabler configured to mask one or more latches arranged in at least some of the plurality of columns, based on a plurality of bit enable signals,
wherein the one or more latches are configured to, when masked by the bitwise enabler, receive write data, without storing the write data; and
a row decoder configured to generate a row enable signal by decoding a row address,
wherein the bitwise enabler comprises a first masking circuit configured to mask first latches arranged in a first column, among the plurality of latches, based on a first bit enable signal,
wherein the memory device further comprises a first masking clock gate configured to output a first masking clock, based on the first bit enable signal, and
wherein the first masking circuit comprises a plurality of first masking AND gates, each of the plurality of first masking AND gates being configured to output, to the first latches arranged in the first column, a latch clock based on the first masking clock and the row enable signal that is received from the row decoder.

17. The memory device of claim 16, further comprising a plurality of row AND gates, each of the plurality of row AND gates being configured to output a latch clock for a respective one of the plurality of rows, based on an AND operation on the first masking clock and the row enable signal that is received from the row decoder,
wherein the first masking circuit comprises a first masking latch configured to output the first bit enable signal, based on the latch clock, and
wherein each of the plurality of first masking AND gates is further configured to output, to the first latches arranged in the first column, the first bit enable signal that is received from the first masking latch, based on the latch clock that is received respectively from the plurality of row AND gates.

18. The memory device of claim 16, further comprising:
a first flip flop configured to output first data, to the first latches arranged in the first column, based on an edge of the first masking clock; and
a second flip flop configured to output second data, to second latches arranged in a second column, among the plurality of latches, based on the edge of a second masking clock.

19. The memory device of claim 18, wherein the bitwise enabler further comprises a second masking circuit configured to mask the second latches arranged in the second column, based on a second bit enable signal,
wherein the memory device further comprises a second masking clock gate configured to output the second masking clock, based on the second bit enable signal,
wherein the first flip flop is further configured to receive the first masking clock, from the first masking clock gate, and
wherein the second flip flop is further configured to receive the second masking clock, from the second masking clock gate.

20. The circuit of claim 1, wherein the first latches and the second latches maintain output data regardless of input data in the lock state.

* * * * *